US009806167B2

(12) United States Patent
Horii et al.

(10) Patent No.: US 9,806,167 B2
(45) Date of Patent: Oct. 31, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventors: Taku Horii, Osaka (JP); Takeyoshi Masuda, Osaka (JP); Ryosuke Kubota, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 23 days.

(21) Appl. No.: 14/908,941

(22) PCT Filed: Jun. 19, 2014

(86) PCT No.: PCT/JP2014/066266
§ 371 (c)(1),
(2) Date: Jan. 29, 2016

(87) PCT Pub. No.: WO2015/015938
PCT Pub. Date: Feb. 5, 2015

(65) Prior Publication Data
US 2016/0163817 A1    Jun. 9, 2016

(30) Foreign Application Priority Data

Jul. 31, 2013  (JP) ................................ 2013-159233

(51) Int. Cl.
*H01L 29/66*   (2006.01)
*H01L 29/16*   (2006.01)
(Continued)

(52) U.S. Cl.
CPC .... *H01L 29/66068* (2013.01); *H01L 21/0465* (2013.01); *H01L 29/086* (2013.01);
(Continued)

(58) Field of Classification Search
None
See application file for complete search history.

(56) References Cited

U.S. PATENT DOCUMENTS

2004/0211980 A1* 10/2004 Ryu ...................... H01L 21/049
                                                      257/200
2009/0020765 A1*  1/2009 Miura .................. H01L 29/086
                                                      257/77
2012/0184094 A1   7/2012 Yamada

FOREIGN PATENT DOCUMENTS

JP    2003-318397 A    11/2003
JP    2006524433 A     10/2006
(Continued)

OTHER PUBLICATIONS

International Search Report in PCT International Application No. PCT/JP2014/066266, dated Sep. 9, 2014.
(Continued)

*Primary Examiner* — Alexander Ghyka
(74) *Attorney, Agent, or Firm* — Venable LLP; Michael A. Sartori; Laura G. Remus

(57) ABSTRACT

The steps of preparing a silicon carbide layer having a main surface, forming on the main surface, a first mask layer located on a first region to be a channel region and having a first opening portion on each of opposing regions with the first region lying therebetween, and forming a high-concentration impurity region having a first conductivity type and being higher in impurity concentration than the silicon carbide layer in a region exposed through the first opening portion, by implanting ions into the main surface with the first mask layer being interposed are included.

1 Claim, 14 Drawing Sheets

(51) Int. Cl.
*H01L 29/08* (2006.01)
*H01L 29/739* (2006.01)
*H01L 29/78* (2006.01)
*H01L 21/04* (2006.01)
*H01L 29/10* (2006.01)

(52) U.S. Cl.
CPC ...... *H01L 29/0856* (2013.01); *H01L 29/0869* (2013.01); *H01L 29/0878* (2013.01); *H01L 29/0886* (2013.01); *H01L 29/1095* (2013.01); *H01L 29/1608* (2013.01); *H01L 29/66712* (2013.01); *H01L 29/7395* (2013.01); *H01L 29/7802* (2013.01)

(56) References Cited

FOREIGN PATENT DOCUMENTS

| | | |
|---|---|---|
| JP | 2006-303323 A | 11/2006 |
| JP | 2006-303324 A | 11/2006 |
| JP | 2012-124536 A | 6/2012 |
| JP | 2012-146838 A | 8/2012 |
| WO | WO-2004/097926 A1 | 11/2004 |

OTHER PUBLICATIONS

Notice of Grounds of Rejection in counterpart Japanese Patent Application No. 2013-159233, dated Oct. 11, 2016.

\* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, and relates to a method for manufacturing a silicon carbide semiconductor device capable of achieving improved dimension accuracy of a channel length.

BACKGROUND ART

In order to allow a semiconductor device such as a metal oxide semiconductor field effect transistor (MOSFET) to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, Japanese Patent Laying-Open No. 2012-146838 (PTD 1) describes a MOSFET having an n-type source region, a p-type body region, and an n-type SiC region. According to the MOSFET described in Japanese Patent Laying-Open No. 2012-146838, as a voltage is applied to a gate voltage, an inversion layer is formed in a channel region CH in the p-type body region directly under a gate insulating film and a current flows between a source electrode and a drain electrode.

CITATION LIST

Patent Document

PTD 1: Japanese Patent Laying-Open No. 2012-146838

SUMMARY OF INVENTION

Technical Problem

The present inventors have been studying increase in thickness of a gate insulating layer in contact with a JFET region after forming an n-type region having a high impurity concentration in the JFET region adjacent to channel region CH, for the purpose to lower a capacitance of a silicon carbide semiconductor device.

Here, a method of forming an n-type region having a high impurity concentration by implanting ions while channel region CH is protected by a mask after channel region CH is formed is available as a method of forming the n-type region.

The n-type region, however, is formed to be adjacent to channel region CH. Therefore, a channel length fluctuates depending on a position of a mask opening portion with respect to channel region CH. For example, when the n-type region is formed to overlap with channel region CH formed on a silicon carbide substrate (to protrude into channel region CH), a channel length decreases by an amount of overlap between the n-type region and channel region CH (protrusion into channel region CH).

The present invention was made to solve the problem as described above. A primary object of the present invention is to provide a method for manufacturing a silicon carbide semiconductor device capable of achieving suppression of fluctuation in channel length.

Solution to Problem

A method for manufacturing a silicon carbide semiconductor device according to the present invention includes the steps of preparing a silicon carbide layer having a main surface, forming on the main surface, a first mask layer located on a first region to be channel region CH and having a first opening portion on each of opposing regions with the first region lying therebetween, and forming a high-concentration impurity region having a first conductivity type and being higher in impurity concentration than the silicon carbide layer in the region exposed through the first opening portion, by implanting ions into the main surface with the first mask layer being interposed.

Advantageous Effects of Invention

According to the present invention, a method for manufacturing a silicon carbide semiconductor device capable of achieving suppression of fluctuation in channel length can be provided.

DESCRIPTION OF EMBODIMENTS

Figure 1:
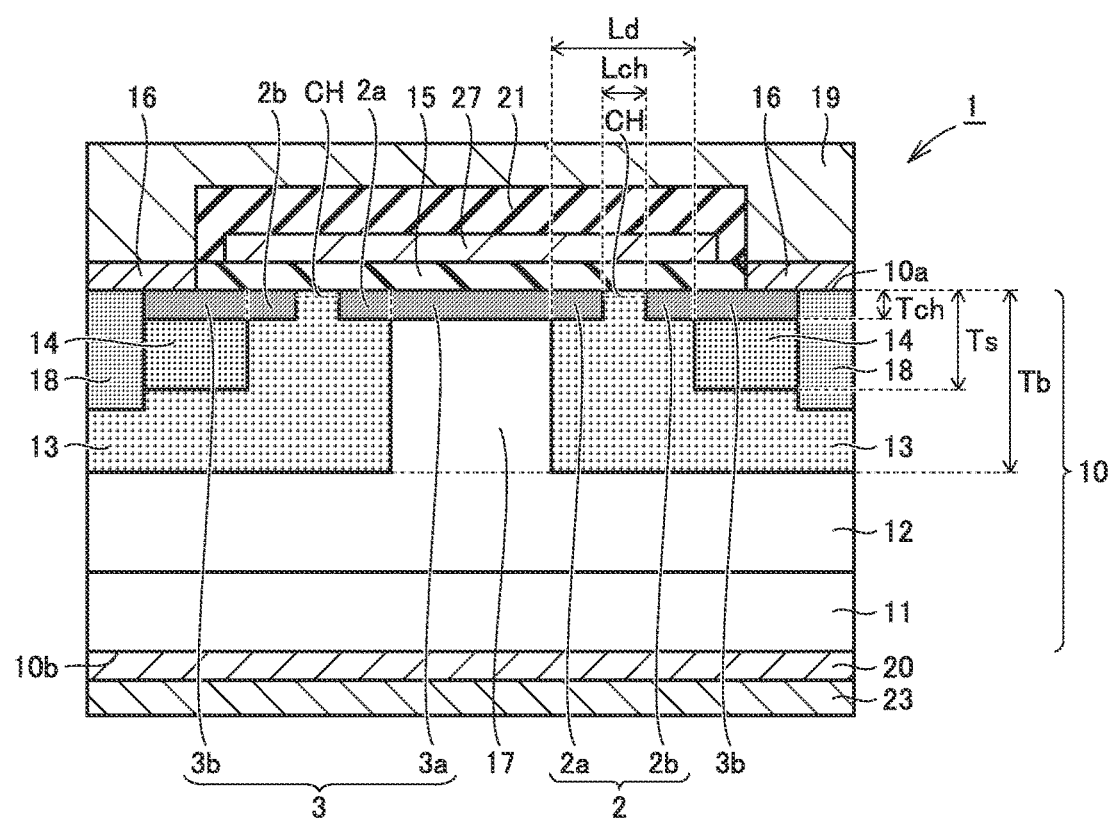
FIG. 1 is a schematic cross-sectional view schematically showing a structure of a silicon carbide semiconductor device according to a first embodiment of the present invention.

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is normally expressed by a number with a bar "–" thereabove, however, a negative sign herein precedes a number. In expressing an angle, a system in which a total azimuth angle is defined as 360 degrees is employed.

Overview of an embodiment of the present invention will initially be described.

Figure 4:
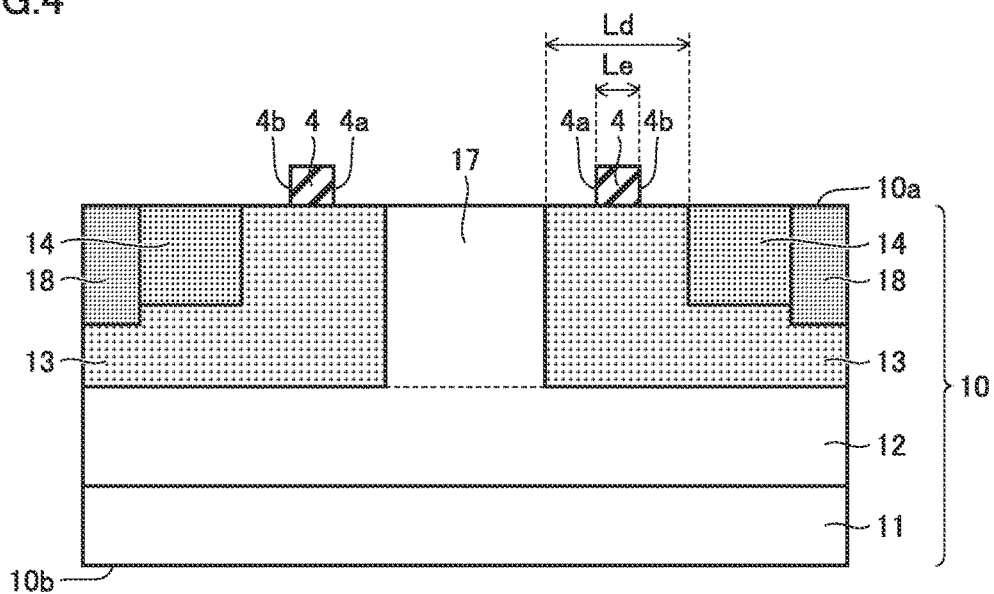
FIG. 4 is a schematic cross-sectional view schematically showing a second step in the method for manufacturing a silicon carbide semiconductor device according to the first embodiment of the present invention.
Figure 15:
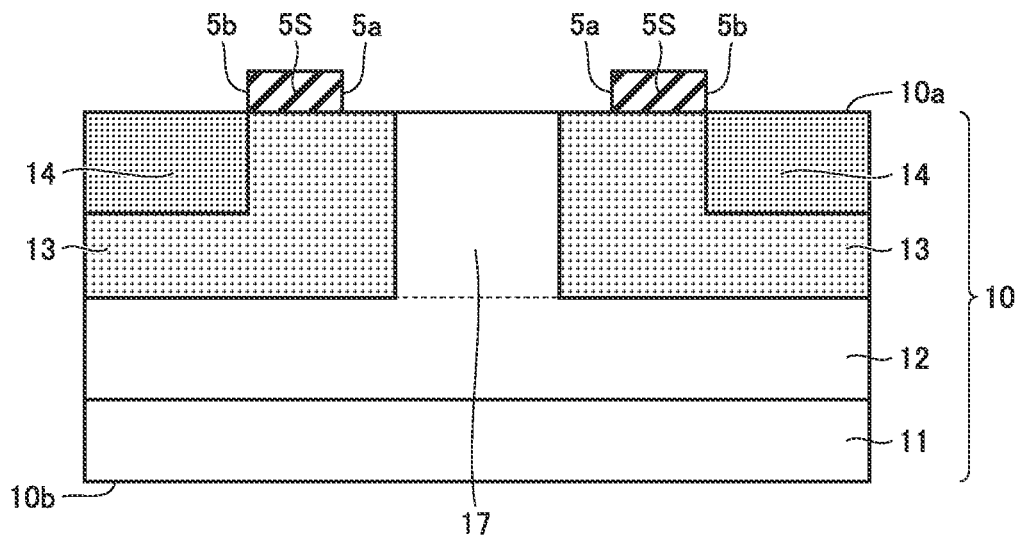
FIG. 15 is a schematic cross-sectional view schematically showing a fifth step in the method for manufacturing a silicon carbide semiconductor device according to the second embodiment of the present invention.

(1) A method for manufacturing a silicon carbide semiconductor device according to the embodiment includes the steps of preparing a silicon carbide layer 10 having a main surface 10a, forming on main surface 10a, a first mask layer (a first mask layer 4 in FIG. 4, a first mask layer 5S in FIG. 15, and a first mask layer 7 in FIG. 19; to be understood similarly hereafter) located on a first region (a part of a body region 13) to be channel region CH and having a first opening portion (opening portions 4a and 4b in FIG. 4, opening portions 5a and 5b in FIG. 15, and opening portions 7a and 7b in FIG. 19; to be understood similarly hereafter) on a portion other than the first region in each of opposing regions with the first region lying therebetween (S25), and forming a high-concentration impurity region (n+ regions 2 and 3) having a first conductivity type and being higher in impurity concentration than the silicon carbide layer in the region (conductive regions 14 and 17 in FIGS. 4 and 15 and an epitaxial layer 12 in FIG. 19) exposed through the first opening portion, by implanting ions into main surface 10a with the first mask layer being interposed (S30).

Figure 7:
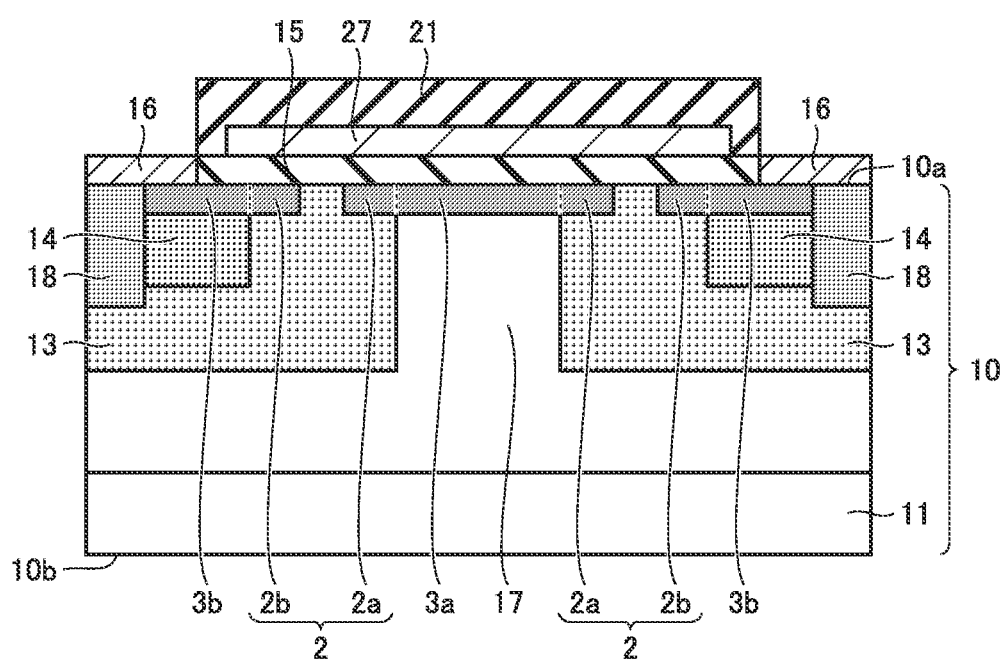
FIG. 7 is a schematic cross-sectional view schematically showing a fifth step in the method for manufacturing a silicon carbide semiconductor device according to the first embodiment of the present invention.

According to the method for manufacturing a silicon carbide semiconductor device in the embodiment, the first mask layer used in forming the high-concentration impurity region (n+ regions 2 and 3) having the first conductivity type is located on the first region to be channel region CH and has the first opening portion on each of the opposing regions with channel region CH lying therebetween (a portion other than the first region in a source region 14, a drift region 17, and body region 13). Namely, the first opening portion has two opening portions between which channel region CH lies (4a and 4b in FIGS. 4, 5a and 5b in FIGS. 15, and 7a and 7b in FIG. 19). By doing so, an interval Lch (see FIGS. 1, 9, and 17) along a channel direction of main surface 10a, between the high-concentration impurity regions (a first n+ region 2a and a second n+ region 2b or a second n+ region 3b) formed with the first region to be channel region CH lying therebetween and with the first mask layer being interposed is determined by a dimension (a distance between the two opening portions of the first opening portion) of the first mask layer, without being dependent on accuracy in alignment of the first mask layer with respect to main surface 10a. Variation in dimension (variation in process) of the first mask layer can be controlled to be less than variation in alignment of the first mask layer. Namely, by forming the high-concentration impurity region (n+ regions 2 and 3) having the first conductivity type with the use of the first mask layer, a second impurity region (body region 13) having a second conductivity type lies between the high-concentration impurity regions (n+ regions 2 and 3) along the channel direction at main surface 10a. Here, however, variation in interval Lch along the channel direction at main surface 10a between the high-concentration impurity regions is suppressed. Here, in a silicon carbide semiconductor device 1 having an inversion layer rather than an accumulation layer as a channel, a channel length is defined as interval Lch along the channel direction at main surface 10a between the high-concentration impurity regions having the first conductivity type. Therefore, according to the method for manufacturing a silicon carbide semiconductor device in the present embodiment, silicon carbide semiconductor device 1 of an inversion type in which fluctuation in channel length is suppressed as compared with a case of use of a plurality of mask layers for forming a high-concentration impurity region having the first conductivity type can be obtained. By making interval Lch smaller than a width Ld of body region 13 at main surface 10a, a channel length of silicon carbide semiconductor device 1 can be decreased and an on-resistance can be lowered. As a first n+ region 3a is formed here on drift region 17, a thickness of a gate insulating layer 15 on first n+ region 3a can be increased as compared with a case of absence of first n+ region 3a. Consequently, a capacitance of silicon carbide semiconductor device 1 can be lowered while lowering in drain current is suppressed.

(2) In the method for manufacturing a silicon carbide semiconductor device according to the embodiment, in the preparing step (S10), silicon carbide layer 10 includes, in main surface 10a, source region 14 having the first conductivity type, body region 13 which is adjacent to the first impurity region and has the second conductivity type different from the first conductivity type, and drift region 17 which is adjacent to a second impurity region in a direction opposite to a direction in which the first impurity region is located when viewed from the second impurity region and has the first conductivity type, and source region 14 and body region 17 may be formed in the main surface as being opposed to each other, with body region 13 being interposed. Furthermore, the first region is a part of body region 13, and in the step of forming first mask layer 4, first mask layer 4 may be formed such that first opening portions 4a and 4b in first mask layer 4 include a portion (opening portion 4a) reaching drift region 17 from one end portion of the first region on a side of drift region 17 and a portion (opening portion 4b) reaching source region 14 from the other end portion on a side of source region 14.

By doing so, ions are implanted with new first mask layer 4 being interposed, separately from a mask for forming body region 13, source region 14, and drift region 17, so that n+ regions 2 and 3 can simultaneously be formed with channel region CH lying therebetween. Therefore, as described above, fluctuation in channel length of the silicon carbide semiconductor device can be suppressed.

(3) In the method for manufacturing a silicon carbide semiconductor device according the embodiment, the preparing step (S10) includes the steps of forming in silicon carbide layer 10, body region 13 having the second conductivity type different from the first conductivity type (S15), forming a second mask layer 5L having a second opening portion (an opening portion 5b) including a region where source region 14 having the first conductivity type is to be formed in body region 13 and covering at least the first region (S16), and forming source region 14 having the first conductivity type by implanting ions into main surface 10a with second mask layer 5L being interposed (S17). In the step of forming a first mask layer (S25), first mask layer 5S having first opening portions 5a and 5b (see FIG. 15) is formed by partially removing second mask layer 5L, and first opening portions 5a and 5b in first mask layer 4 may include a portion (opening portion 5a) reaching drift region 17 from one end portion of the first region on a side of drift region 17 and second opening portion 5b.

By doing so, while second opening portion 5b used for forming source region 14 is maintained by protecting the second opening portion, for example, with a resist film in second mask layer 5L as an ion implantation mask used for forming source region 14, a portion thereof covering drift region 17 opposed to source region 14 with body region 13 lying therebetween is partially removed. Then, first mask layer 5S having first opening portions 5a and 5b on body region 13 and body region 17 can be formed. By implanting ions into main surface 10a with first mask layer 5S being interposed, first n+ regions 2a, 3a, and 3b can simultaneously be formed in body region 17 and source region 14. Here, since second opening portion 5b is not processed, n+ region 3 is formed in source region 14 on the side of source region 14 and does not protrude into body region 13. Therefore, in further forming opening portion 5a on the side of body region 17 (step (S21)), a channel length of the silicon carbide semiconductor device is controlled by controlling a dimension of opening portion 5a. Variation in dimension of opening portion 5a can be controlled to be less than variation in alignment of the mask layer. Therefore, fluctuation in channel length of the silicon carbide semiconductor device can be suppressed as described above also by processing and using second mask layer 5L used for forming source region 14 again for first mask layer 5S. In this case, since first mask layer 5S for forming n+ regions 2a, 3a, and 3b is formed by processing second mask layer 5L, the step of forming first mask layer 5S can be simplified.

(4) In the method for manufacturing a silicon carbide semiconductor device according to the embodiment, in the step of forming a high-concentration impurity region (S30), the high-concentration impurity region (n+ region 3) may include a first high-concentration impurity region (n+ region 3a) and source region 14 opposed to each other with the first region to be channel region CH lying therebetween. Here, the method may further include the steps of forming a third mask layer 8 having a third opening portion 8b at least on the first region and on a region including source region 14 (S31) and forming body region 13 having a second conductivity type different from the first conductivity type, including channel region CH, and surrounding source region 14, by implanting ions into main surface 10a with third mask layer 8 being interposed (S32).

By doing so, the first high-concentration impurity region (n+ region 3a) and a second high-concentration impurity region (n+ region 3b) as source region 14 can simultaneously be formed with channel region CH lying therebetween. Therefore, as compared with a case of separate formation of source region 14 and n+ region 3, the steps of forming a mask layer for ion implantation and implanting ions can be reduced. Furthermore, as body region 13 is formed to include a part of first n+ region 3a and second n+ region 3b, channel region CH can be formed in a region within body region 13 lying between first n+ region 3a and second n+ region 3b. Therefore, as described above, fluctuation in channel length of the silicon carbide semiconductor device can be suppressed.

Here, the inventors have been studying increase in thickness of a gate insulating layer on a JFET region by forming the gate insulating layer in contact with the JFET region after formation of an n-type region having a high impurity concentration (hereinafter also referred to as an n+ region) in the JFET region in order to lower a capacitance of a silicon carbide semiconductor device. In this case, the n+ region is formed, for example, by implanting ions onto the JFET region. Here, though ions are implanted with the use of a mask, a position where the n+ region is formed fluctuates with respect to the JFET region in accordance with accuracy in alignment of the mask. Channel region CH formed in the silicon carbide substrate is formed to be adjacent to the JFET region. Therefore, when the n+ region fluctuates with respect to the JFET region and it is formed to protrude toward channel region CH, a channel length will decrease or an impurity concentration in channel region CH will fluctuate. As a result of dedicated studies, the inventors have found that a channel length can be defined by a width of one mask and fluctuation in channel length can be suppressed by forming an n+ region by using a mask having an opening portion on each of regions opposed to each other with channel region CH lying therebetween (one of which is a JFET region), and derived the method for manufacturing a silicon carbide layer described above.

The embodiment of the present invention will now be described in further detail.

First Embodiment

A silicon carbide semiconductor device according to a first embodiment will be described with reference to FIG. 1. A MOSFET 1 representing one example of a silicon carbide semiconductor device in the first embodiment mainly has silicon carbide layer 10, gate insulating layer 15, a gate electrode 27, a source contact electrode 16, a drain electrode 20, an interlayer insulating film 21, a source interconnection 19, and a pad electrode 23.

Silicon carbide layer 10 is composed, for example, of hexagonal silicon carbide having a polytype 4H. For example, main surface 10a of silicon carbide layer 10 may be a surface angled off approximately by at most 8° relative to a {0001} plane or may be a {0-33-8} plane.

Silicon carbide layer 10 mainly includes a base substrate 11, drift region 17, body region 13, source region 14, a p+ region 18, n+ region 2, first n+ region 3a, and second n+ region 3b. Base substrate 11 is a silicon carbide single crystal substrate composed of silicon carbide and having the n conductivity type (the first conductivity type). Epitaxial layer 12 including drift region 17 is a silicon carbide epitaxial layer arranged on base substrate 11 and drift region 17 has the n conductivity type. An impurity contained in drift region 17 is, for example, nitrogen (N). A concentration of nitrogen contained in drift region 17 is, for example, approximately $5 \times 10^{15}$ cm$^{-3}$. Drift region 17 includes a JFET region lying between a pair of body regions 13 which will be described later.

Body region 13 is in contact with drift region 17 and first main surface 10a. Body region 13 has the p-type (the second conductivity type). Body region 13 contains such an impurity (acceptor) as aluminum or boron. A concentration of the acceptor contained in body region 13 is, for example, approximately not lower than $4 \times 10^{16}$ cm$^{-3}$ and not higher than $2 \times 10^{18}$ cm$^{-3}$. A concentration of the impurity (acceptor) contained in body region 13 is higher than a concentration of the impurity (donor) contained in drift region 17.

Source region 14 is in contact with body region 13 and first main surface 10a and spaced apart from drift region 17 by body region 13. Source region 14 is formed to be surrounded by body region 13. Source region 14 has the n-type. Source region 14 contains such an impurity (donor) as phosphorus (P). A concentration of the impurity (donor) contained in source region 14 is, for example, approximately $2 \times 10^{19}$ cm$^{-3}$. A concentration of the impurity (donor) contained in source region 14 is higher than a concentration of the impurity (acceptor) contained in body region 13 and higher than a concentration of the impurity (donor) contained in drift region 17.

P+ region 18 is arranged as being in contact with first main surface 10a, source region 14, and body region 13. P+ region 18 is formed to be surrounded by source region 14 and to extend from first main surface 10a to body region 13. P+ region 18 is a p-type region containing such an impurity (acceptor) as Al. A concentration of the impurity (acceptor) contained in p+ region 18 is higher than a concentration of the impurity (acceptor) contained in body region 13. A concentration of the impurity (acceptor) in p+ region 18 is, for example, approximately $1 \times 10^{20}$ cm$^{-3}$.

N+ region 2 is arranged to protrude from at least one side of source region 14 and drift region 17 into body region 13. Here, n+ region 2 is connected to n+ region 3 formed on source region 14 and drift region 17. Specifically, first n+ region 2a is connected to first n+ region 3a formed on drift region 17, at an interface between drift region 17 and body region 13. Second n+ region 2b is connected to second n+ region 3b formed on source region 14, at an interface between source region 14 and body region 13. N+ regions 2 and 3 are in contact with gate insulating layer 15 and have the n-type (the first conductivity type). N+ regions 2 and 3 contain an impurity (donor) such as phosphorus. A concentration of the impurity (donor) contained in n+ regions 2 and 3 is, for example, approximately $1 \times 10^{16}$ cm$^{-3}$. Preferably, a concentration of the impurity (donor) contained in n+ regions 2 and 3 is, for example, approximately not lower than $1 \times 10^{15}$ cm$^{-3}$ and not higher than $1 \times 10^{17}$ cm$^{-3}$. A depth Tch of n+ regions 2 and 3 into main surface 10a along a direction of thickness of silicon carbide layer 10 is smaller than a depth Ts of source region 14 into main surface 10a.

As described above, first n+ region 3a is arranged as lying between drift region 17 and gate insulating layer 15. As shown in FIG. 1, when silicon carbide layer 10 has a pair of body regions 13 opposed to each other in a cross-sectional view, first n+ region 3a is formed such that drift region 17 lying between one body region 13 and the other body region 13 is spaced apart from gate insulating layer 15 with first n+ region 3a being interposed. First n+ region 3a may be similar in impurity concentration to second n+ region 2b.

Second n+ region 3b is arranged as lying between source region 14 and gate insulating layer 15 as described above. Second n+ region 3b may be similar in impurity concentration to second n+ region 2b.

Gate insulating layer 15 is arranged to be in contact with body region 13, first n+ region 2a, second n+ region 2b, first n+ region 3a, and second n+ region 3b, at first main surface 10a of silicon carbide layer 10. Gate insulating layer 15 is composed, for example, of silicon dioxide (SiO$_2$). Gate insulating layer 15 on first n+ regions 2a and 3a and second n+ regions 2b and 3b is greater in thickness by 3 nm or more and preferably by 5 nm or more than gate insulating layer 15 on body region 13. Gate insulating layer 15 on first n+ regions 2a and 3a and second n+ regions 2b and 3b has a thickness, for example, approximately not smaller than 45 nm and not greater than 70 nm.

Gate electrode 27 is arranged to be opposed to body region 13, first n+ region 2a, second n+ region 2b, first n+ region 3a, and second n+ region 3b, with gate insulating layer 15 being interposed. Gate electrode 27 is arranged to be in contact with gate insulating layer 15 such that gate insulating layer 15 lies between gate electrode 27 and silicon carbide layer 10. Gate electrode 27 is composed, for example, of polysilicon to which an impurity has been added or such a conductor as aluminum.

Source contact electrode 16 is arranged to be in contact with source region 14, p+ region 18, and gate insulating layer 15. Source contact electrode 16 may be in contact with second n+ region 3b. Source contact electrode 16 is composed of a material which can establish ohmic contact with source region 14, such as NiSi (nickel silicide). Source contact electrode 16 may be composed of a material including Ti, Al, and Si.

Drain electrode 20 is formed to be in contact with a second main surface 10b of silicon carbide layer 10. This drain electrode 20 is composed of a material which can establish ohmic contact with n-type base substrate 11, such as NiSi, and electrically connected to base substrate 11. Pad electrode 23 is arranged to be in contact with drain electrode 20.

Interlayer insulating film 21 is formed to be in contact with gate insulating layer 15 and to surround gate electrode 27. Interlayer insulating film 21 is composed, for example, of silicon dioxide representing an insulator. Source interconnection 19 surrounds interlayer insulating film 21 at a position opposed to first main surface 10a of silicon carbide layer 10 and is in contact with an upper surface of source contact electrode 16. Source interconnection 19 is composed of such a conductor as Al and electrically connected to source region 14 with source contact electrode 16 being interposed.

An operation of MOSFET 1 will now be described. Referring to FIG. 1, when a voltage of gate electrode 27 is lower than a threshold voltage, that is, in an off state, a pn junction between body region 13 located directly under gate insulating layer 15 and drift region 17 is reverse biased and is in a non-conducting state. When a voltage not lower than the threshold voltage is applied to gate electrode 27, an inversion layer is formed in channel region CH which is a portion in body region 13 in contact with gate insulating layer 15. Consequently, source region 14 and drift region 17 are electrically connected to each other and a current flows between source interconnection 19 and drain electrode 20.

One example of a method for manufacturing MOSFET 1 in the present embodiment will now be described with reference to FIGS. 2 to 7.

Figure 2:
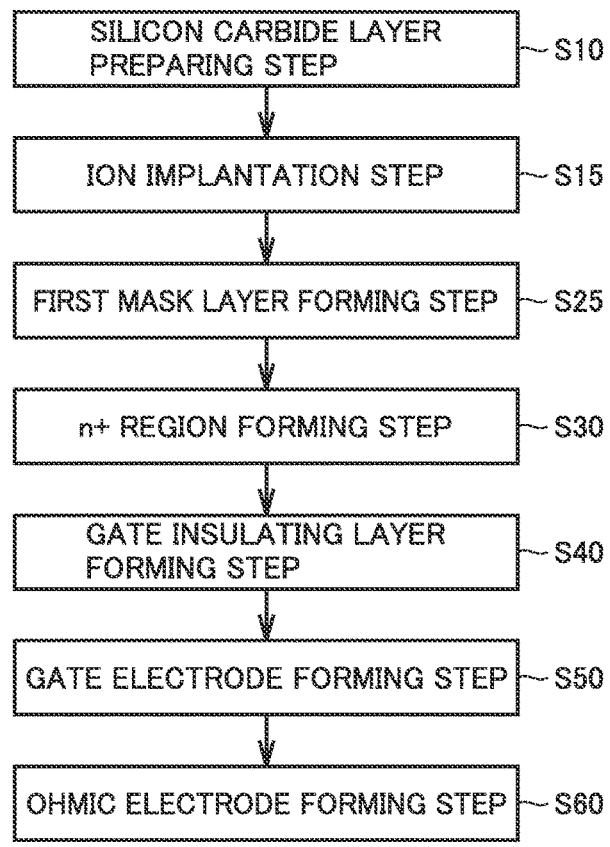
FIG. 2 is a flowchart schematically showing a method for manufacturing a silicon carbide semiconductor device according to the first embodiment of the present invention.
Figure 3:
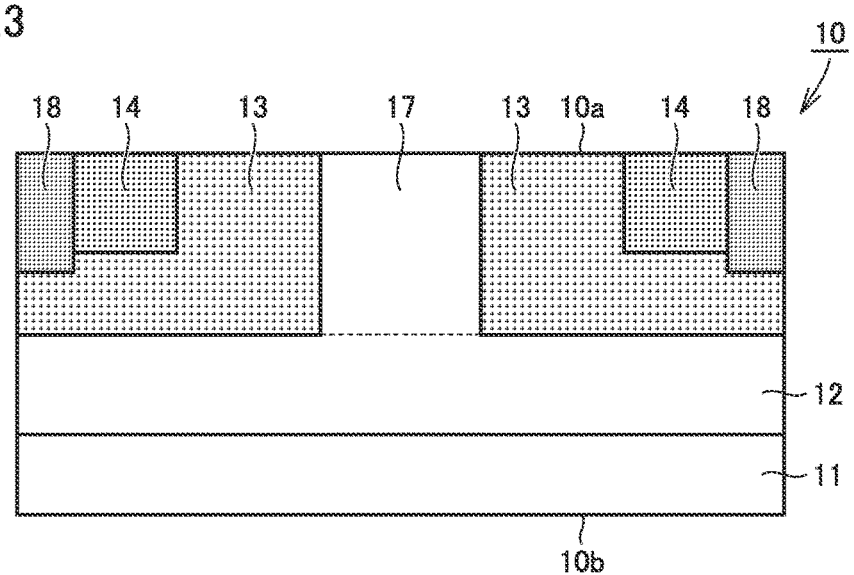
FIG. 3 is a schematic cross-sectional view schematically showing a first step in the method for manufacturing a silicon carbide semiconductor device according to the first embodiment of the present invention.

Initially, a silicon carbide substrate preparing step (S10: FIG. 2) is performed. Specifically, for example, base substrate 11 having polytype 4H and composed of hexagonal silicon carbide is prepared and epitaxial layer 12 including drift region 17 having the n-type (the first conductivity type) is formed on base substrate 11 through epitaxial growth. Drift region 17 contains an impurity such as N (nitrogen) ions.

Then, an ion implantation forming step (S20: FIG. 2) is performed. Specifically, referring to FIG. 3, for example, Al (aluminum) ions are implanted into drift region 17 so that body region 13 is formed. Then, ions are implanted for forming source region 14. Specifically, for example, P (phosphorus) ions are implanted into body region 13 so that source region 14 is formed in body region 13. In addition, ions are implanted for forming p+ region 18. Specifically, for example, Al ions are implanted into body region 13 so that p+ region 18 in contact with source region 14 is formed in body region 13. Ions can be implanted, for example, by forming a mask layer composed of silicon dioxide and having an opening in a desired region into which ions are to be implanted on main surface 10a of drift region 17 and implanting ions with the use of the mask layer.

Then, a first mask layer forming step (S25: FIG. 2) is performed. In the first mask layer forming step, first mask layer 4 in contact with body region 13 at first main surface 10a is formed. Specifically, referring to FIG. 4, first mask layer 4 covering a region to be channel region CH in body region 13 and having first opening portions 4a and 4b on conductive regions opposed to each other with channel region CH lying therebetween is formed. More specifically, first mask layer 4 is formed on first main surface 10a of silicon carbide layer 10 so as to cover a part of body region 13 at first main surface 10a. First mask layer 4 is an ion implantation mask which will be described later and composed, for example, of silicon dioxide or a resist. Here, a width Le along a direction in parallel to first main surface 10a, of first mask layer 4 formed on body region 13 should only be determined in accordance with a channel length of MOSFET 1. Width Le along the direction in parallel to first main surface 10a, of first mask layer 4 formed on body region 13 is substantially the same as the channel length described above, and for example, approximately not smaller than 0.2 µm and not greater than 0.6 µm. Namely, in the present embodiment, width Le of first mask layer 4 is shorter than width Ld of body region 13.

Figure 5:
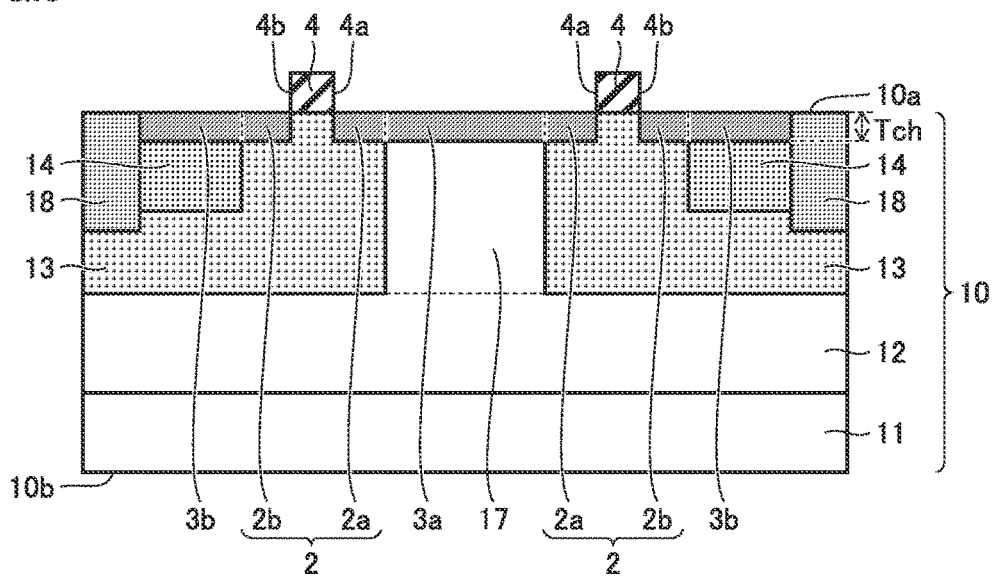
FIG. 5 is a schematic cross-sectional view schematically showing a third step in the method for manufacturing a silicon carbide semiconductor device according to the first embodiment of the present invention.
Figure 6:
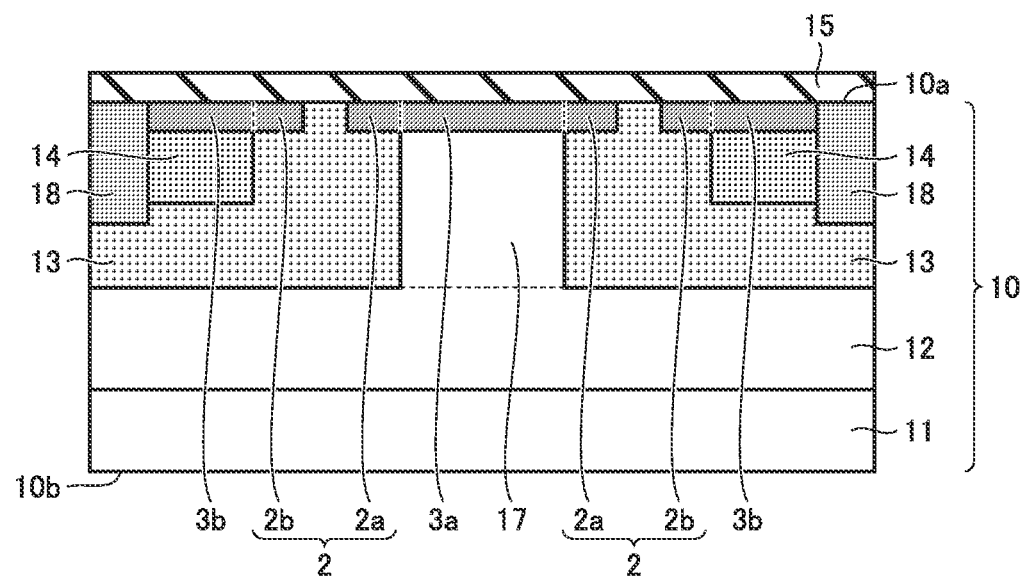
FIG. 6 is a schematic cross-sectional view schematically showing a fourth step in the method for manufacturing a silicon carbide semiconductor device according to the first embodiment of the present invention.

Then, an n+ region forming step (S30: FIG. 2) is performed. Referring to FIG. 5, n+ regions 2 and 3 are formed with the use of first mask layer 4. Specifically, with the use of first mask layer 4, such an impurity (donor) as phosphorus ions is introduced into body region 13, so that first n+ region 2a protruding from the side of drift region 17 into body region 13 and being in contact with first main surface 10a and second n+ region 2b protruding from the side of source region 14 into body region 13 and being in contact with first main surface 10a are formed. Furthermore, simultaneously therewith, first n+ region 3a being in contact with first main surface 10a on drift region 17 and being higher in impurity concentration than drift region 17 and second n+ region 3b being in contact with first main surface 10a on source region 14 and being higher in impurity concentration than drift region 17 are formed. Namely, first n+ regions 2a and 3a are formed by implanting ions into main surface 10a exposed through opening portion 4a in first mask layer 4, and second n+ regions 2b and 3b are formed by implanting ions into main surface 10a exposed through opening portion 4b in first mask layer 4. N+ regions 2a and 2b are formed to protrude from at least one side of source region 14 and drift region 17 into body region 13. N+ regions 3a and 3b are formed to protrude from the side of body region 13 into drift region 17 and source region 14, respectively.

As described above, each of first n+ regions 2a and 3a and second n+ regions 2b and 3b has the n-type (the first conductivity type). N+ regions 2 and 3 contain such an impurity (donor) as phosphorus. A concentration of the impurity (donor) in n+ regions 2 and 3 is, for example, approximately $1 \times 10^{16}$ cm$^{-3}$. Injected energy in the present step (S30) should only be determined, for example, in accordance with dimension Tch of n+ regions 2 and 3 along a direction perpendicular to main surface 10a. A channel length of MOSFET 1 according to the present embodiment is determined by width Le of first mask layer 4 formed in the previous step (S25) and an injection condition (injected energy or the like) in the present step (S30).

Then, an activation annealing step is performed. Specifically, heat treatment for heating silicon carbide layer 10 to, for example, around 1700° C. and holding the silicon carbide layer for approximately 30 minutes in an atmosphere of such an inert gas as argon is performed. The implanted impurity is thus activated. As above, silicon carbide layer 10 having first main surface 10a and second main surface 10b is formed. Silicon carbide layer 10 includes drift region 17 having the n-type (the first conductivity type), body region 13 having the p-type (the second conductivity type) and being in contact with drift region 17, source region 14 having the n-type and arranged to be spaced apart from drift region 17 by body region 13, and n+ regions 2 and 3 arranged to protrude from at least one side of source region 14 and drift region 17 into body region 13, being in contact with first main surface 10a, and having the n-type.

Then, a gate insulating layer forming step (S40: FIG. 2) is performed. Specifically, referring to FIG. 6, heat treatment for heating main surface 10a of silicon carbide layer 10 to a temperature, for example, approximately not lower than 1200° C. and approximately not higher than 1300° C. and holding the silicon carbide layer for approximately 60 minutes, for example, in an oxygen atmosphere is performed. Thus, gate insulating layer 15 being in contact with first main surface 10a of silicon carbide layer 10 and composed of silicon dioxide is formed. Gate insulating layer 15 is formed to be in contact with first n+ regions 2 and 3a, second n+ regions 2b and 3b, and body region 13, at first main surface 10a. Here, n+ regions 2 and 3 are higher in rate of oxidation than body region 13. Therefore, gate insulating layer 15 is formed to be thicker on first n+ regions 2a and 3a and second n+ regions 2b and 3b than on body region 13.

Then, a nitrogen annealing step is performed. Specifically, silicon carbide layer 10 is held, for example, for around 1 hour at a temperature not lower than 1300° C. and not higher than 1500° C. in an atmosphere of nitric oxide. Thereafter, heat treatment for heating silicon carbide layer 10 is performed in an inert gas such as argon or nitrogen. In the heat treatment, silicon carbide layer 10 is held for around 1 hour at a temperature not lower than 1100° C. and not higher than 1500° C.

Then, a gate electrode forming step (S50: FIG. 2) is performed. Specifically, referring to FIG. 7, gate electrode 27 composed of polysilicon which is a conductor to which an impurity has been added at high concentration is formed, for example, through CVD, photolithography, and etching. Thereafter, interlayer insulating film 21 composed of silicon dioxide representing an insulator is formed to surround gate electrode 27, for example, with CVD. Then, interlayer insulating film 21 and gate insulating layer 15 in a region where source contact electrode 16 is to be formed are removed through photolithography and etching.

Then, an ohmic electrode forming step (S60: FIG. 2) is performed. Specifically, a metal film formed, for example, with vapor deposition is formed to be in contact with source region 14 and p+ region 18 at main surface 10a of silicon carbide layer 10. The metal film may contain, for example, Ti (titanium) atoms, Al (aluminum) atoms, and Si (silicon) atoms. The metal film may contain, for example, Ni atoms and Si atoms. After the metal film is formed, the metal film is heated, for example, at around 1000° C. Then, the metal film is heated and silicided. Thus, source contact electrode 16 in ohmic contact with source region 14 of silicon carbide layer 10 is formed. Similarly, a metal film, for example, of Ni is formed to be in contact with second main surface 10b of silicon carbide layer 10, and drain electrode 20 in ohmic contact with silicon carbide layer 10 is formed by heating the metal film.

Then, source interconnection 19 composed of Al representing a conductor is formed to surround interlayer insulating film 21 and to be in contact with source contact electrode 16, for example, through vapor deposition. Pad electrode 23 composed, for example, of Al is formed to be in contact with drain electrode 20. Through the procedure above, MOSFET 1 (see FIG. 1) according to the present embodiment is completed.

A function and effect of MOSFET 1 and the method for manufacturing the same according to the first embodiment will now be described.

In MOSFET 1 according to the present embodiment, gate insulating layer 15 formed on drift region 17 is greater in thickness than gate insulating layer 15 formed on body region 13. Thus, a capacitance of MOSFET 1 can be lowered while lowering in drain current which flows through channel region CH is suppressed.

In MOSFET 1 according to the first embodiment, n+ region 3a is formed in a region of drift region 17 including main surface 10a. Therefore, MOSFET 1 can achieve a high breakdown voltage by setting an impurity concentration in drift region 17 to be low and can achieve a low resistance owing to n+ region 3a.

Channel region CH in MOSFET 1 according to the first embodiment is formed in a region within body region 13 lying between n+ region 2 and n+ region 2b and being in contact with main surface 10a. Namely, MOSFET 1 according to the first embodiment is of an inversion type. A channel length of MOSFET 1 is defined as interval Lch (see FIG. 1) along the channel direction at main surface 10a between first n+ region 2a and second n+ region 2b. Consequently, as will be described later, in the method for manufacturing MOSFET 1 according to the first embodiment, a channel length of MOSFET 1 can be determined in accordance with a dimension (interval Lch) of first mask layer 4 and fluctuation in channel length can be suppressed.

In the method for manufacturing MOSFET 1 according to the present embodiment, in the preparing step (S10), silicon carbide layer 10 includes source region 14 and drift region 17 having the first conductivity type and body region 13 having the second conductivity type different from the first conductivity type, and source region 14 and drift region 17 are formed in main surface 10a to be opposed to each other with body region 13 lying therebetween. In the step of forming a mask film (S20), first mask layer 4 located on body region 13 and having first opening portions 4a and 4b on source region 14 and drift region 17 is formed. By doing so, ions are implanted with new first mask layer 4 being interposed, separately from a mask for forming source region 14, body region 13, and drift region 17, so that n+ regions 2 and 3 can simultaneously be formed with the first region to be channel region CH lying therebetween. Here, interval Lch (see FIG. 1) in an in-plane direction of main surface 10a between first n+ region 2a and second n+ region 2b which are formed with channel region CH lying therebetween and with first mask layer 4 being interposed is determined by a dimension of first mask layer 4, without being dependent on accuracy in alignment of first mask layer 4 with respect to main surface 10a. Since variation in dimension (variation in process) of first mask layer 4 can be controlled to be less than variation in alignment of first mask layer 4, variation in interval Lch can be suppressed. As described above, since MOSFET 1 according to the present embodiment is of what is called an inversion type, a channel length of MOSFET 1 is equivalent to interval Lch in the in-plane direction of main surface 10a between first n+ region 2a and second n+ region 2b in body region 13. Consequently, as variation in interval Lch is suppressed as described above in the method for manufacturing MOSFET 1 according to the first embodiment, fluctuation in channel length of MOSFET 1 or in impurity concentration in channel region CH can be suppressed.

According to the method for manufacturing MOSFET 1 in the present embodiment, in the step of forming an n+ region (S30), n+ region 2 and n+ region 3 are simultaneously formed in a region in body region 13 other than channel region CH and on drift region 17, respectively, with the use of first mask layer 4. As the gate insulating layer forming step (S40) is thereafter performed, gate insulating layer 15 formed on n+ regions 2 and 3 is formed to be greater in thickness than gate insulating layer 15 formed on body region 13. Consequently, a capacitance of MOSFET 1 can be lowered while lowering in drain current is suppressed.

Figure 8:
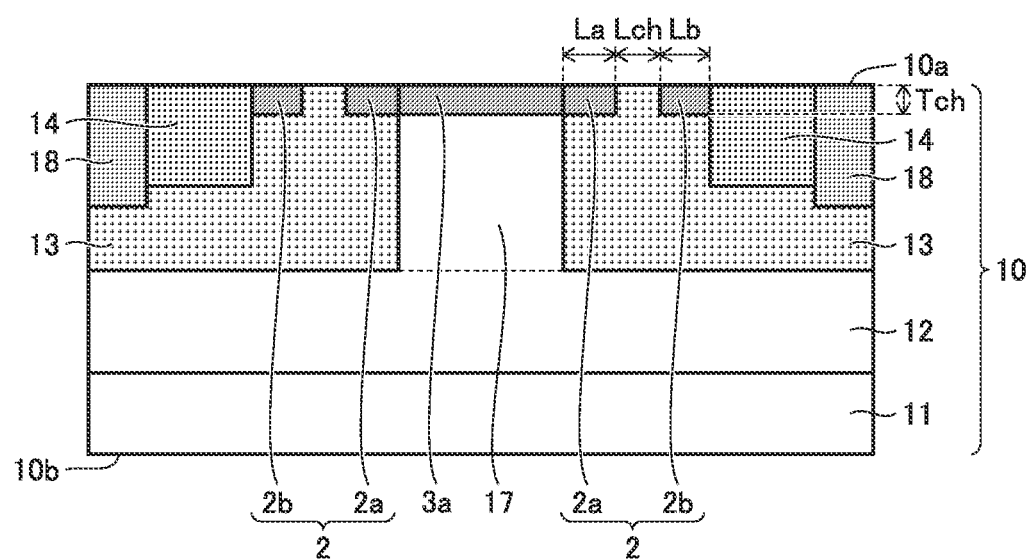
FIG. 8 is a schematic cross-sectional view schematically showing a structure of a modification of the silicon carbide semiconductor device according to the first embodiment of the present invention.

Though silicon carbide layer 10 of MOSFET 1 has second n+ region 3b protruding from body region 13 into source region 14 in the present embodiment, limitation thereto is not intended. For example, referring to FIG. 8, silicon carbide layer 10 does not have to have second n+ region 3b. For example, in the step of forming a mask layer (S20), from a point of view of accuracy in alignment in photolithography, so long as opening portion 4b is reliably formed on a region protruding from the interface between source region 14 and body region 13 toward body region 13, opening portion 4b in first mask layer 4 does not have to be formed widely over source region 14. In this case, second n+ region 3b may not substantially be formed in silicon carbide layer 10. By doing so as well, in the step (S20), even though position displacement of opening portion 4b in first mask layer 4 with respect to main surface 10a takes place, fluctuation in channel length or fluctuation in impurity concentration in channel length CH can be suppressed.

Second Embodiment

Figure 9:
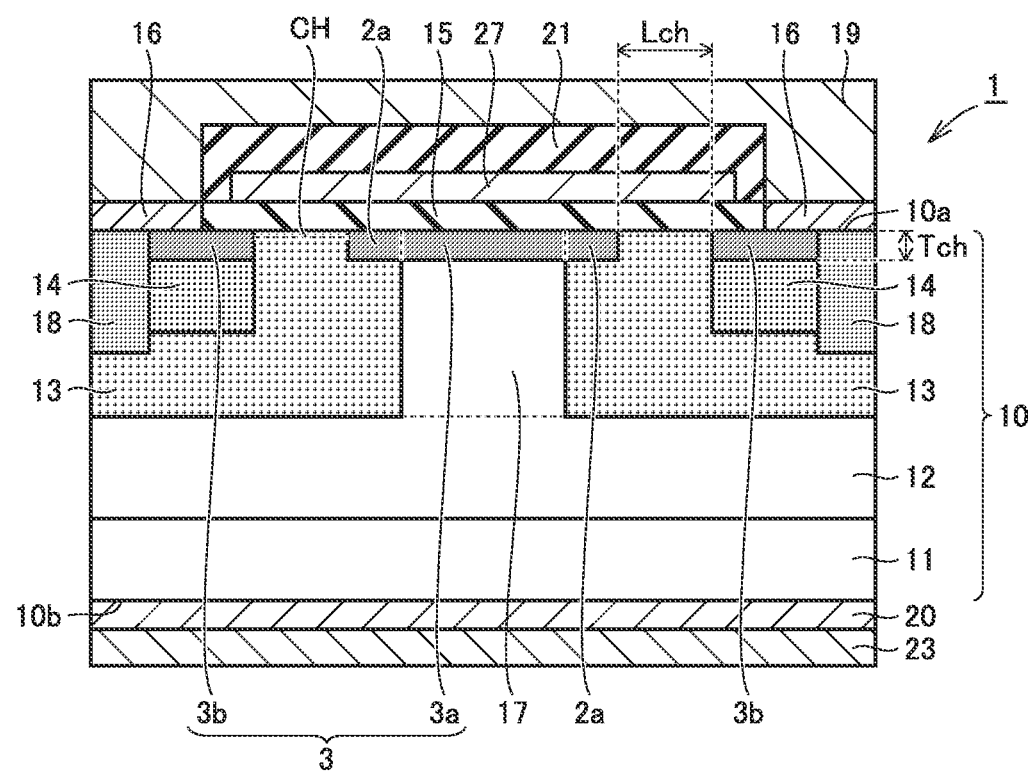
FIG. 9 is a schematic cross-sectional view schematically showing a structure of a silicon carbide semiconductor device according to a second embodiment of the present invention.
Figure 10:
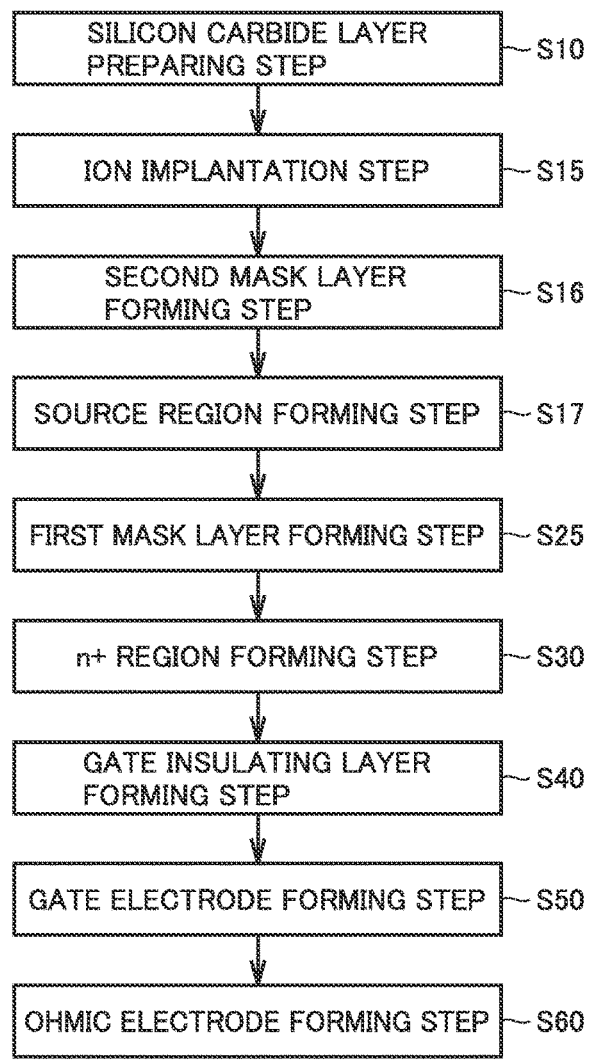
FIG. 10 is a flowchart schematically showing a method for manufacturing a silicon carbide semiconductor device according to the second embodiment of the present invention.
Figure 11:
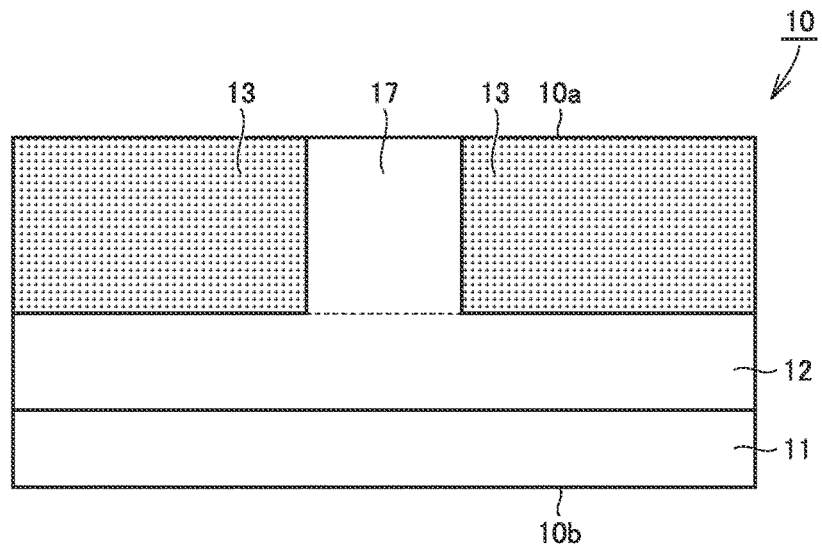
FIG. 11 is a schematic cross-sectional view schematically showing a first step in the method for manufacturing a silicon carbide semiconductor device according to the second embodiment of the present invention.

A silicon carbide semiconductor device and a method for manufacturing the same according to a second embodiment will now be described with reference to FIGS. 9 and 10. Though the silicon carbide semiconductor device according to the second embodiment is basically the same in construction as the silicon carbide semiconductor device according to the first embodiment, it is different in that silicon carbide layer 10 does not include second n+ region 2b. Though the method for manufacturing a silicon carbide semiconductor device according to the second embodiment is basically the same in feature as the method for manufacturing a silicon carbide semiconductor device according to the first embodiment, it is different in that first mask layer 5S as an ion implantation mask for use in the step of forming an n+ region (S30) is formed in the step of forming a second mask layer (S16), through processing of second mask layer 5L used for forming source region 14 in the step of preparing a silicon carbide substrate (S10).

In the second embodiment, first n+ regions 2a, 3a, and 3b are formed as in the first embodiment. On the other hand, second n+ region 2b is not formed as described above. Namely, channel region CH of the silicon carbide semiconductor device (MOSFET 1) according to the second embodiment is formed in a region in body region 13 where first n+ region 2a is not formed.

One example of a method for manufacturing the silicon carbide semiconductor device (MOSFET 1) according to the second embodiment will now be described with reference to FIGS. 9 to 16.

Initially, as in the first embodiment, the silicon carbide substrate preparing step (S10: FIG. 10) is performed. Specifically, for example, base substrate 11 having polytype 4H and composed of hexagonal silicon carbide is prepared and epitaxial layer 12 (drift region 17) having the n-type (the first conductivity type) is formed on base substrate 11 through epitaxial growth.

Then, the ion implantation forming step (S15: FIG. 10) is performed. Specifically, referring to FIG. 11, for example, Al (aluminum) ions are implanted into epitaxial layer 12 (drift region 17) so that body region 13 is formed. Ions can be implanted, for example, by forming a mask layer composed of silicon dioxide and having an opening in a desired region into which ions are to be implanted on main surface 10a of drift region 17 and implanting ions by using the mask layer.

Figure 12:
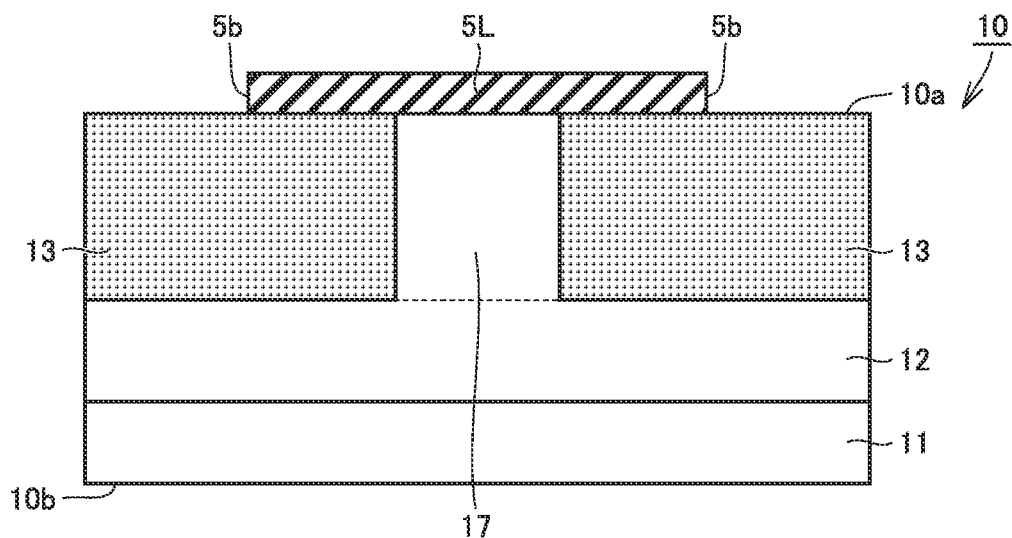
FIG. 12 is a schematic cross-sectional view schematically showing a second step in the method for manufacturing a silicon carbide semiconductor device according to the second embodiment of the present invention.

Then, a second mask layer forming step (S16: FIG. 10) is performed. Referring to FIG. 12, in the present step (S16), second mask layer 5L in contact with body region 13 and drift region 17 at first main surface 10a is formed. Specifically, second mask layer 5L having second opening portion 5b including a region to be source region 14 is formed. Second mask layer 5L is an ion implantation mask which will be described later and composed, for example, of silicon dioxide.

Figure 13:
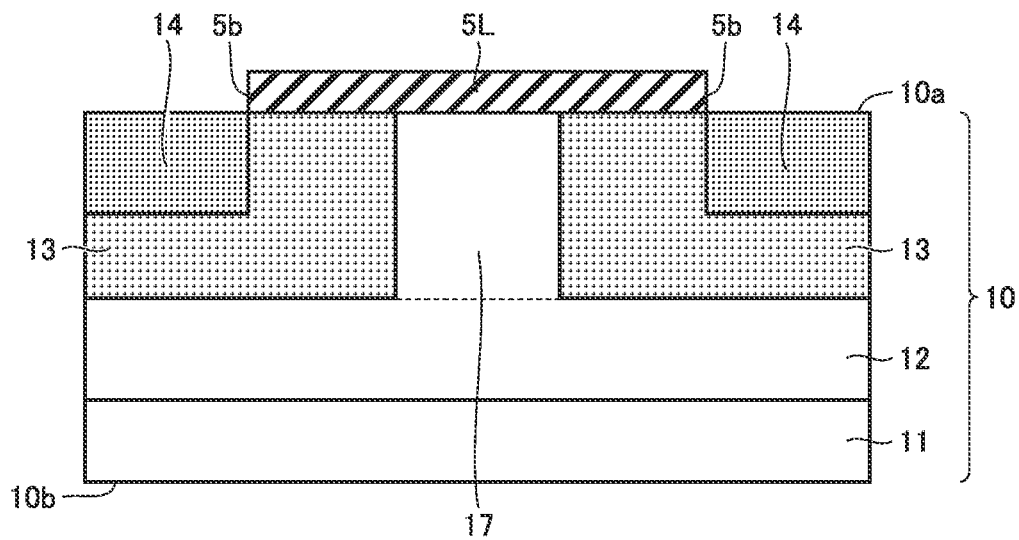
FIG. 13 is a schematic cross-sectional view schematically showing a third step in the method for manufacturing a silicon carbide semiconductor device according to the second embodiment of the present invention.
Figure 14:
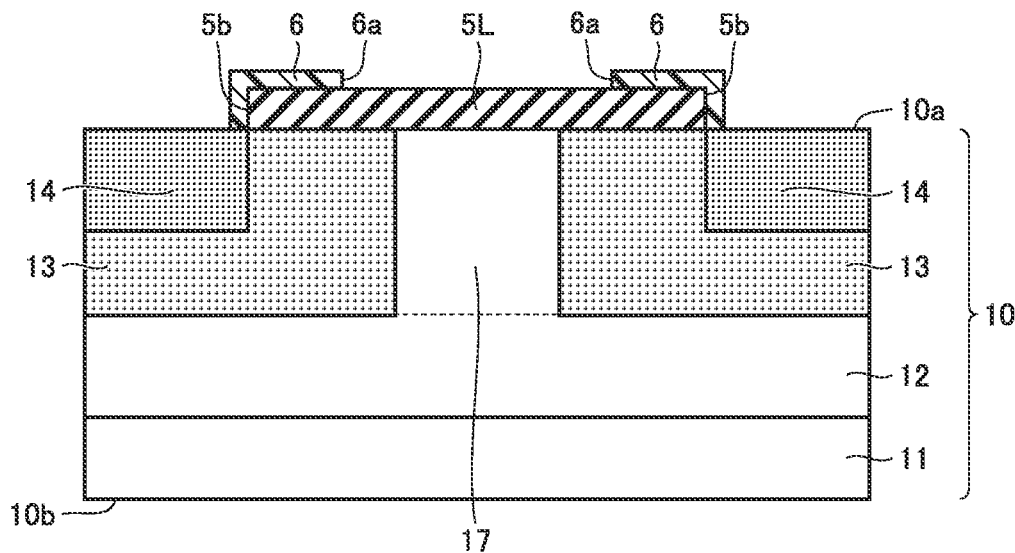
FIG. 14 is a schematic cross-sectional view schematically showing a fourth step in the method for manufacturing a silicon carbide semiconductor device according to the second embodiment of the present invention.

Then, a source region 14 forming step (S17: FIG. 10) is performed. Referring to FIG. 13, source region 14 is formed with the use of second mask layer 5L. Specifically, with the use of second mask layer 5L, such an impurity (donor) as phosphorus ions is introduced into body region 13, so that source region 14 is formed in body region 13.

Then, the mask layer forming step (S25: FIG. 10) is performed. Initially, referring to FIG. 14, a mask film 6 covering an end surface of second opening portion 5b in second mask layer 5L and having an opening portion 6a on second mask layer 5L formed on body region 13 and drift region 17 is formed. Then, referring to FIG. 15, first mask layer 5S having first opening portions 5a and 5b is formed by carrying out, for example, dry etching with the use of mask film 6. Opening portion 5a exposes a part of body region 13 and the entire surface of drift region 17 lying between a pair of source regions 14 at main surface 10a. Namely, first mask layer 5S is formed to cover at least a region to be channel region CH.

Figure 16:
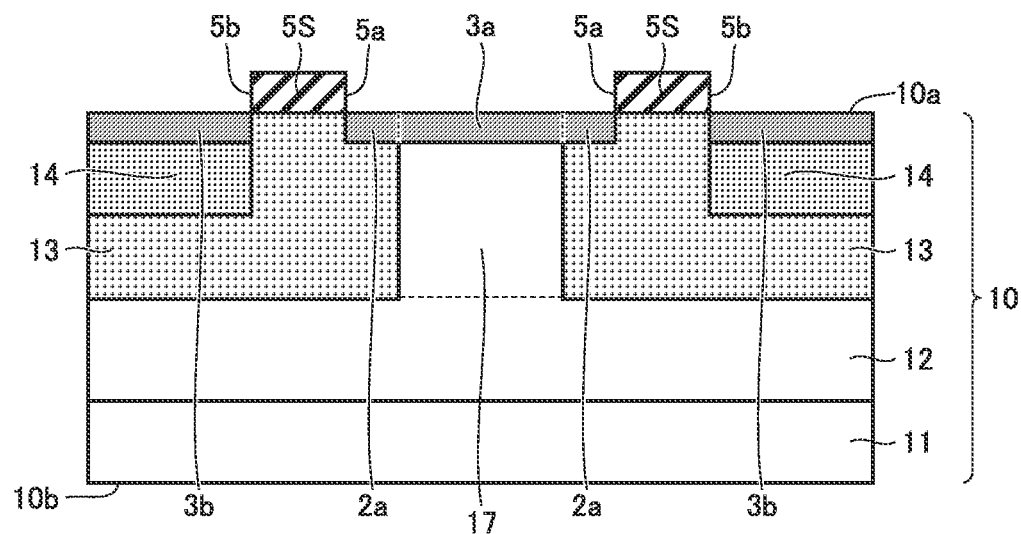
FIG. 16 is a schematic cross-sectional view schematically showing a sixth step in the method for manufacturing a silicon carbide semiconductor device according to the second embodiment of the present invention.

Then, the n+ region forming step (S30: FIG. 10) is performed. Referring to FIG. 16, n+ regions 2a and 3b are formed with the use of mask layer 5. Specifically, with the use of mask layer 5, such an impurity (donor) as phosphorus ions is introduced into body region 13, so that first n+ region 2a protruding from the side of drift region 17 into body region 13 and being in contact with first main surface 10a is formed. Simultaneously therewith, first n+ region 3a in contact with first main surface 10a on drift region 17 and higher in impurity concentration than drift region 17 and second n+ region 3b in contact with first main surface 10a at the entire surface of source region 14 and higher in impurity concentration than drift region 17 are formed. Namely, first n+ regions 2a and 3a are formed by implanting ions into main surface 10a exposed through opening portion 5a of first opening portions 5a and 5b in first mask layer 5S, and second n+ region 3b is formed by implanting ions into main surface 10a exposed through second opening portion 5b. First n+ region 2a is formed to protrude from at least one side of source region 14 and drift region 17 into body region 13. N+ regions 3a and 3b are formed to protrude from the side of body region 13 into drift region 17 and source region 14, respectively.

Figure 17:
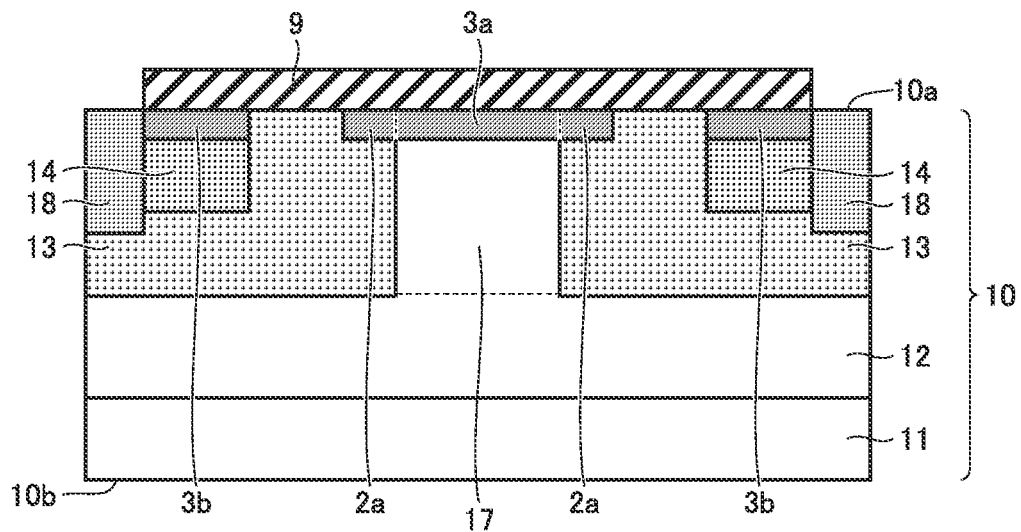
FIG. 17 is a schematic cross-sectional view schematically showing a seventh step in the method for manufacturing a silicon carbide semiconductor device according to the second embodiment of the present invention.

Then, ion implantation for forming p+ region 18 is carried out. Referring to FIG. 17, a mask layer 9 (a mask layer for forming the p+ region) having an opening portion on a region to be p+ region 18 is initially formed. Then, with the use of mask layer 9, for example, Al ions are implanted into second n+ region 3b and source region 14 located below the same. Thus, p+ region 18 in contact with source region 14 is formed in body region 13.

Then, the activation annealing step is performed. MOSFET 1 (see FIG. 9) according to the second embodiment is completed by thereafter performing the steps (S40 to S60) the same as in the method for manufacturing MOSFET 1 according to the first embodiment.

A function and effect of MOSFET 1 and the method for manufacturing the same according to the second embodiment will now be described.

In MOSFET 1 according to the second embodiment, as in the MOSFET according to the first embodiment, gate insulating layer 15 formed on drift region 17 is greater in thickness than gate insulating layer 15 formed on body region 13. Thus, a capacitance of MOSFET 1 can be lowered while lowering in drain current which flows through channel region CH is suppressed.

In MOSFET 1 according to the second embodiment, n+ region 3a is formed in a region of drift region 17 including main surface 10a. Therefore, MOSFET 1 can achieve a high breakdown voltage by setting an impurity concentration in drift region 17 to be low and can achieve a low resistance owing to n+ region 3a.

Channel region CH in MOSFET 1 according to the second embodiment is formed in a region in contact with main surface 10a, within body region 13 lying between n+ region 2a and n+ region 3b. Namely, MOSFET 1 according to the second embodiment is of an inversion type. Therefore, a channel length of MOSFET 1 is defined as interval Lch (see FIG. 9) along the channel direction at main surface 10a between first n+ region 2a and second n+ region 3b. Consequently, as will be described later, in the method for manufacturing MOSFET 1 according to the second embodiment, a channel length of MOSFET 1 can be determined in accordance with a dimension (interval Lch) of first mask layer 5S and fluctuation in channel length can be suppressed.

In the method for manufacturing MOSFET 1 according to the second embodiment, second mask layer 5L used for forming source region 14 is processed, so that first mask layer 5S used for forming n+ regions 2a and 3b is formed. Specifically, first mask layer 5S is formed, as opening portion 5a is formed while second opening portion 5b which has been formed in second mask layer 5L is protected by mask film 6. By doing so, as compared with the method for manufacturing MOSFET 1 according to the first embodiment in which an ion implantation mask was used to form an impurity concentration in source region 14 and the like, thereafter the ion implantation mask is removed, and an ion implantation mask for forming n+ regions 2a and 3b is further newly formed and processed, the number of steps can be reduced. Here, by implanting ions with first mask layer 5S being interposed, which is formed by processing second mask layer 5L used for forming source region 14 as in the method for manufacturing MOSFET 1 according to the first embodiment, n+ regions 2a and 3b can simultaneously be formed such that channel region CH lies therebetween. Furthermore, here, interval Lch (see FIG. 9) along the channel direction at main surface 10a between first n+ region 2a and second n+ region 3b which are formed with channel region CH lying therebetween and with first mask layer 5S being interposed is determined in accordance with a dimension of first mask layer 5S (see FIG. 16), without being dependent on accuracy in alignment of first mask layer 5S with respect to main surface 10a. As described above, MOSFET 1 according to the second embodiment is of what is called an inversion type. Therefore, similarly to MOSFET 1 according to the first embodiment, a channel length of MOSFET 1 according to the second embodiment is equivalent to interval Lch in the in-plane direction of main surface 10a between first n+ region 2a and second n+ region 3b in body region 13. Consequently, as variation in interval Lch is suppressed as described above in the method for manufacturing MOSFET 1 according to the second embodiment, fluctuation in channel length of MOSFET 1 or in impurity concentration in channel region CH can be suppressed.

In addition, according to the method for manufacturing MOSFET 1 in the second embodiment, as in the method for manufacturing MOSFET 1 according to the first embodiment, in the step of forming an n+ region (S30), n+ region 2 and second n+ region 3b are simultaneously formed in a region of body region 13 other than channel region CH and on drift region 17, respectively, with the use of first mask layer 4. Thereafter, as the gate insulating layer forming step (S40) is performed, gate insulating layer 15 formed on n+ regions 2 and 3b is formed to be greater in thickness than gate insulating layer 15 formed on body region 13. Consequently, a capacitance of MOSFET 1 can be lowered while lowering in drain current is suppressed.

Third Embodiment

Figure 18:
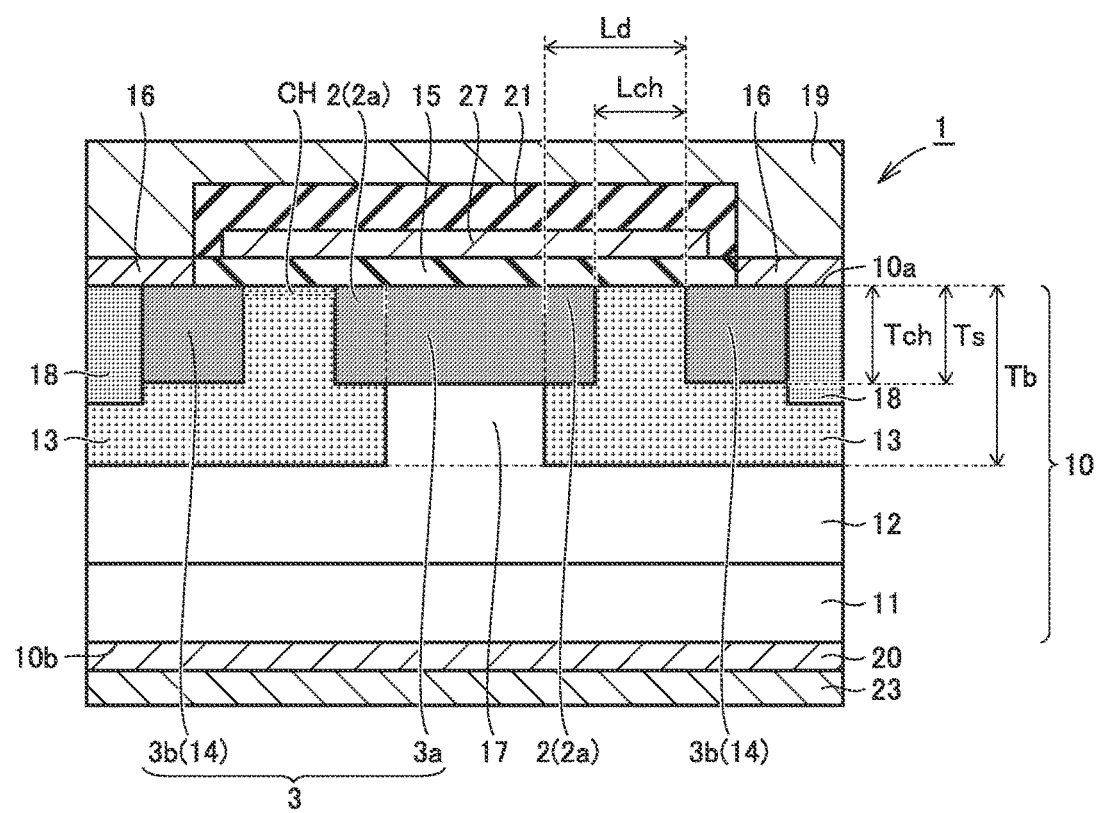
FIG. 18 is a schematic cross-sectional view schematically showing a structure of a silicon carbide semiconductor device according to a third embodiment of the present invention.
Figure 19:
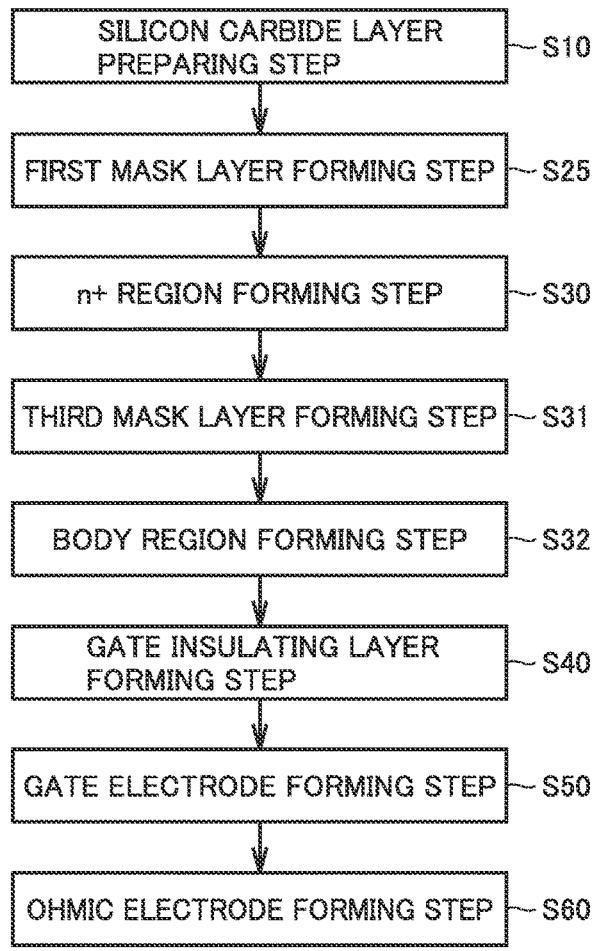
FIG. 19 is a flowchart schematically showing a method for manufacturing a silicon carbide semiconductor device according to the third embodiment of the present invention.

A silicon carbide semiconductor device and a method for manufacturing the same according to a third embodiment will now be described with reference to FIGS. 18 and 19. Though the silicon carbide semiconductor device according to the third embodiment is basically the same in construction as the silicon carbide semiconductor device according to the first embodiment, it is different in that second n+ region 2b is not formed and second n+ region 3b is formed as a source region.

Though the method for manufacturing a silicon carbide semiconductor device according to the third embodiment is basically the same in feature as the method for manufacturing a silicon carbide semiconductor device according to the first embodiment, it is different in that second n+ region 3b as a source region is formed by forming only drift region 17 in the step of preparing a silicon carbide substrate (S10) and performing the step of forming an n+ region (S30) with the use of first mask layer 7 covering a region to be channel region CH and in that body region 13 is formed with the use of third mask layer 8 covering drift region 17 after n+ regions 2 and 3 are formed.

In the third embodiment, first n+ regions 2a and 3a are formed in main surface 10a to protrude into body region 13 from the interface between source region 14 and body region 13 and the interface between drift region 17 and body region 13 such that channel region CH lies therebetween as in the first embodiment. As described above, second n+ region 2b is not formed and second n+ region 3b is formed as source region 14. Specifically, second n+ region 3b is formed from main surface 10a to a position at a depth Ts in the direction of thickness of silicon carbide layer 10. A concentration of an impurity (donor) in n+ regions 2 and 3 is, for example, approximately not lower than $1\times10^{18}$ cm$^{-3}$ and not higher than $1\times10^{20}$ cm$^{-3}$. Namely, in the third embodiment, n+ regions 2 and 3 are comparable in impurity concentration to source region 14 in the first and second embodiments.

One example of a method for manufacturing a silicon carbide semiconductor device (MOSFET 1) in the second embodiment will now be described with reference to FIGS. 19 to 24.

Initially, as in the first embodiment, the silicon carbide substrate preparing step (S10: FIG. 19) is performed. Specifically, for example, base substrate 11 having polytype 4H and composed of hexagonal silicon carbide is prepared and drift region 17 having the n-type (the first conductivity type) is formed on base substrate 11 through epitaxial growth.

Figure 20:
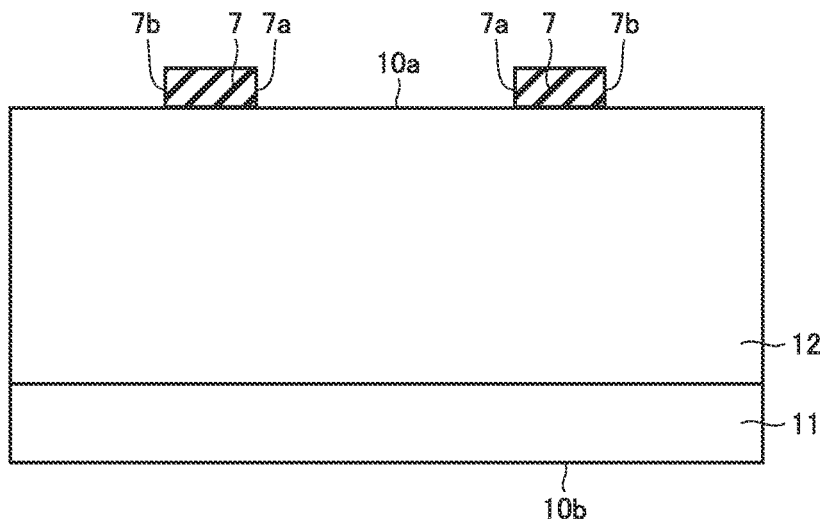
FIG. 20 is a schematic cross-sectional view schematically showing a first step in the method for manufacturing a silicon carbide semiconductor device according to the third embodiment of the present invention.

Then, the first mask layer forming step (S25: FIG. 19) is performed. Referring to FIG. 20, in the present step (S25), first mask layer 7 covering a region to be channel region CH is formed. Specifically, first mask layer 7 having opening portion 7b exposing a region to be source region 14 and having opening portion 7a exposing the entire surface of the region to be drift region 17 and a part of a region to be body region 13 is formed on main surface 10a. First mask layer 7 is an ion implantation mask which will be described later and composed, for example, of silicon dioxide or a resist.

Figure 21:
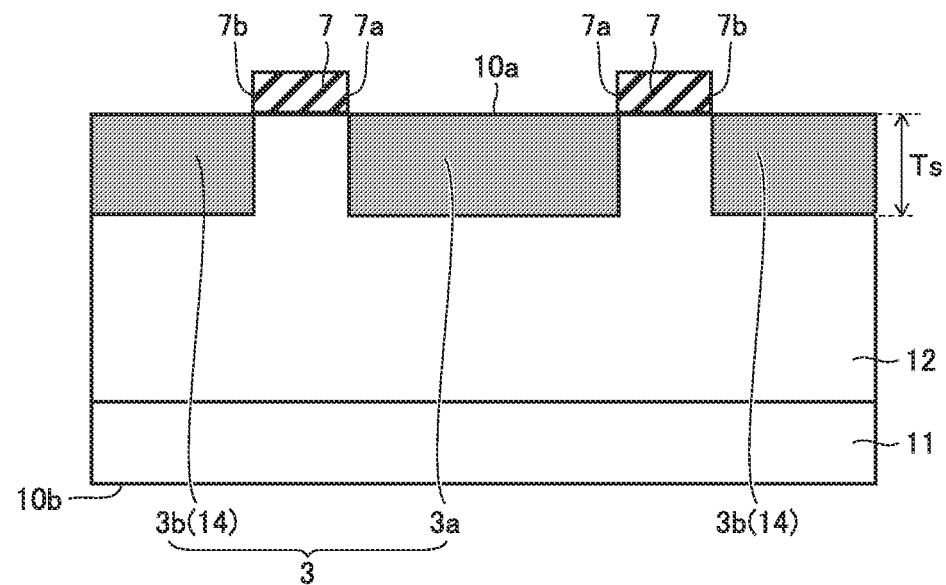
FIG. 21 is a schematic cross-sectional view schematically showing a second step in the method for manufacturing a silicon carbide semiconductor device according to the third embodiment of the present invention.

Then, the n+ region forming step (S30: FIG. 19) is performed. Referring to FIG. 21, n+ region 3 is formed with the use of first mask layer 7. Specifically, with the use of first mask layer 7, such an impurity (donor) as phosphorus ions is introduced into body region 13, so that n+ region 3 is formed in drift region 17. Then, first mask layer 7 is removed from main surface 10a.

Figure 22:
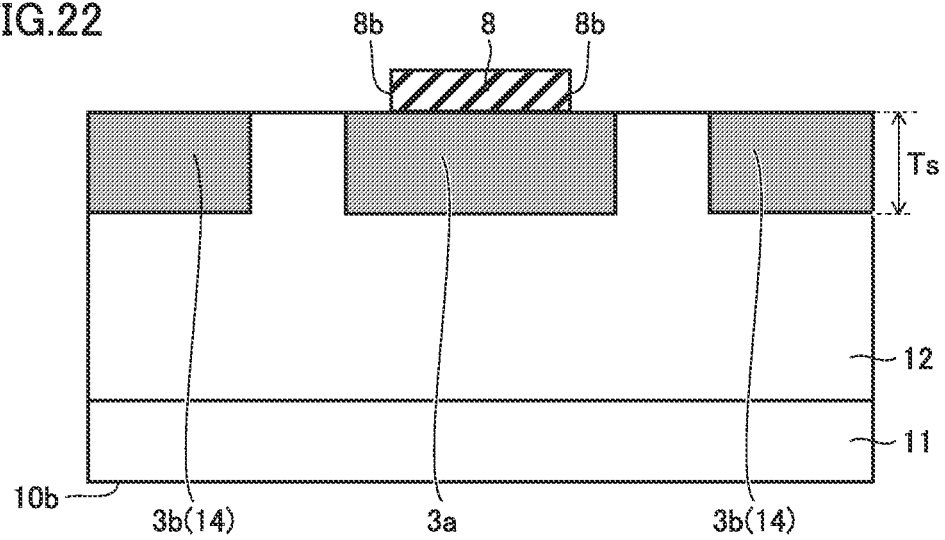
FIG. 22 is a schematic cross-sectional view schematically showing a third step in the method for manufacturing a silicon carbide semiconductor device according to the third embodiment of the present invention.

Then, a third mask layer forming step (S31: FIG. 19) is performed. Referring to FIG. 22, third mask layer 8 having third opening portion 8b for exposing a region to be body region 13 is formed. Third mask layer 8 is formed to cover drift region 17.

Figure 23:
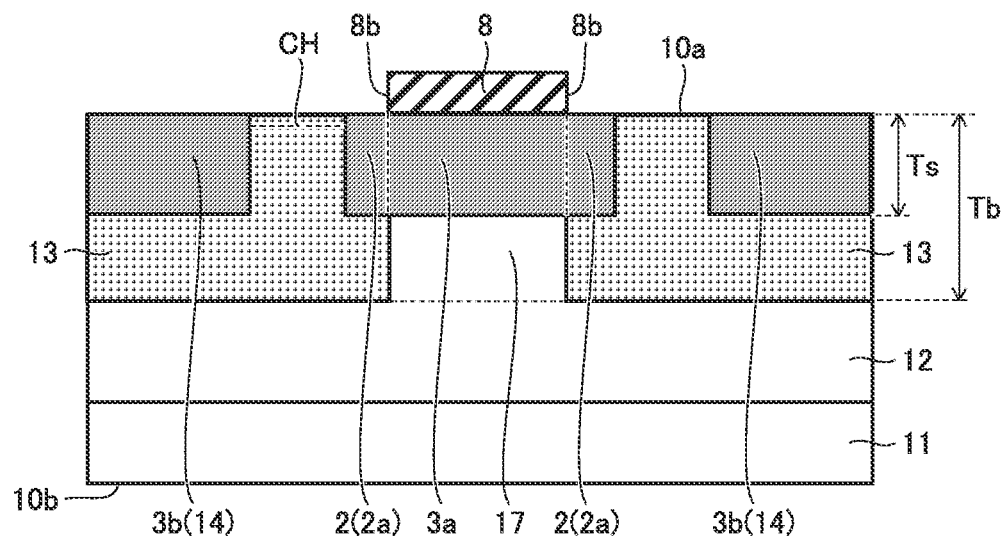
FIG. 23 is a schematic cross-sectional view schematically showing a fourth step in the method for manufacturing a silicon carbide semiconductor device according to the third embodiment of the present invention.

Then, a body region forming step (S32: FIG. 19) is performed. Referring to FIG. 23, body region 13 is formed with the use of third mask layer 8. Specifically, an impurity (donor) such as Al ions is introduced into body region 13 with the use of third mask layer 8, so that body region 13 is formed in drift region 17. Here, body region 13 is formed such that a dimension Tb of body region 13 along the direction perpendicular to main surface 10a is greater than dimension Ts of source region 14 along the direction perpendicular to main surface 10a. Body region 13 thus formed have first n+ region 2a in the vicinity of the interface with drift region 17. Body region 13 has second n+ region 3b therein. Thus, channel region CH defined by first n+ region 2a and second n+ region 3b is formed in body region 13.

Figure 24:
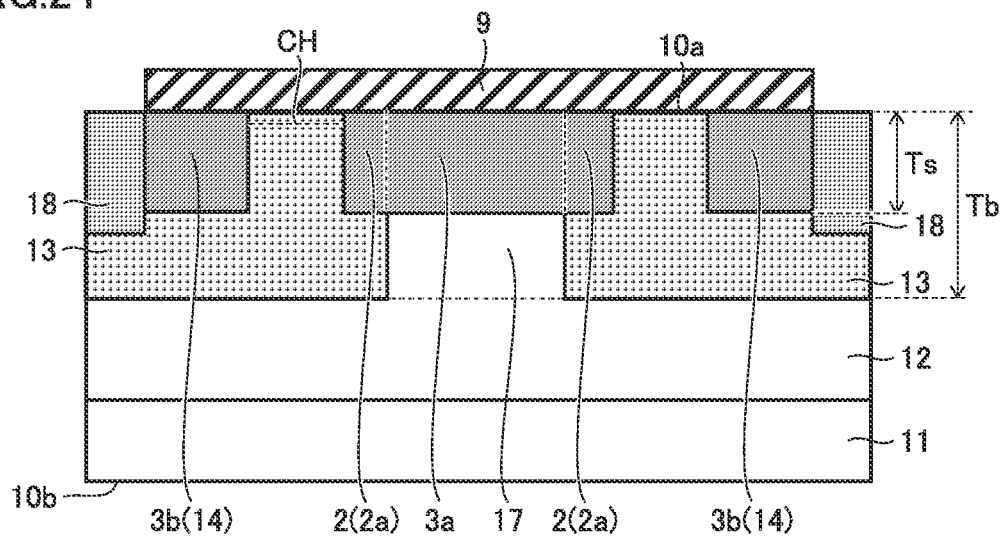
FIG. 24 is a schematic cross-sectional view schematically showing a fifth step in the method for manufacturing a silicon carbide semiconductor device according to the third embodiment of the present invention.

Then, ions are implanted for forming p+ region 18. Referring to FIG. 24, initially, mask layer 9 (mask layer for forming the p+ region) having an opening portion on a region to be p+ region 18 is formed. Then, in second n+ region 3b and source region 14 located under the same, with the use of mask layer 9, for example, Al ions are implanted into body region 13 so that p+ region 18 in contact with source region 14 is formed in body region 13.

Then, the activation annealing step is performed. Specifically, heat treatment for heating silicon carbide layer 10 to, for example, around 1700° C. and holding the silicon carbide layer for approximately 30 minutes in an atmosphere of such an inert gas as argon is performed. The implanted impurity is thus activated. As above, silicon carbide layer 10 having first main surface 10a and second main surface 10b is formed. Silicon carbide layer 10 includes drift region 17 having the n-type (the first conductivity type), body region 13 having the p-type (the second conductivity type) and being in contact with drift region 17, source region 14 having the n-type and arranged to be spaced apart from drift region 17 by body region 13, and n+ regions 2 and 3 arranged to protrude from at least one side of source region 14 and drift region 17 into body region 13, being in contact with first main surface 10a, and having the n-type.

Then, the gate insulating layer forming step (S40: FIG. 2) is performed. Specifically, as in the step shown in FIG. 6, heat treatment for heating main surface 10a of silicon carbide layer 10 to a temperature, for example, approximately not lower than 1200° C. and approximately not higher than 1300° C. and holding the silicon carbide layer for approximately 60 minutes, for example, in an oxygen atmosphere is performed. Thus, gate insulating layer 15 being in contact with first main surface 10a of silicon carbide layer 10 and composed of silicon dioxide is formed.

Gate insulating layer 15 is formed to be in contact with first n+ regions 2a and 3a, second n+ regions 2b and 3b, and body region 13, at first main surface 10a. Here, n+ regions 2 and 3 are higher in rate of oxidation than body region 13. Therefore, gate insulating layer 15 is formed to be thicker on first n+ regions 2a and 3a and second n+ regions 2b and 3b than on body region 13.

Then, the nitrogen annealing step is performed. Specifically, silicon carbide layer 10 is held, for example, for around 1 hour at a temperature not lower than 1300° C. and not higher than 1500° C. in an atmosphere of nitric oxide. Thereafter, heat treatment for heating silicon carbide layer 10 is performed in an inert gas such as argon or nitrogen. In the heat treatment, silicon carbide layer 10 is held for around 1 hour at a temperature not lower than 1100° C. and not higher than 1500° C.

Then, the gate electrode forming step (S50: FIG. 2) is performed. Specifically, as in the step shown in FIG. 7, gate electrode 27 composed of polysilicon representing a conductor to which an impurity has been added at a high concentration is formed, for example, through CVD, photolithography, and etching. Thereafter, interlayer insulating film 21 composed of silicon dioxide representing an insulator is formed to surround gate electrode 27, for example, with CVD. Then, interlayer insulating film 21 and gate insulating layer 15 in a region where source contact electrode 16 is to be formed are removed through photolithography and etching.

Then, the ohmic electrode forming step (S60: FIG. 2) is performed. Specifically, a metal film formed, for example, with vapor deposition is formed to be in contact with source region 14 and p+ region 18 at main surface 10a of silicon carbide layer 10. The metal film may contain, for example, Ti (titanium) atoms, Al (aluminum) atoms, and Si (silicon) atoms. The metal film may contain, for example, Ni atoms and Si atoms. After the metal film is formed, the metal film is heated, for example, at around 1000° C. Then, the metal film is heated and silicided. Thus, source contact electrode 16 in ohmic contact with source region 14 of silicon carbide layer 10 is formed. Similarly, a metal film of Ni or the like is formed to be in contact with second main surface 10b of silicon carbide layer 10, and drain electrode 20 in ohmic contact with silicon carbide layer 10 is formed by heating the metal film.

Then, source interconnection 19 composed of Al representing a conductor is formed to surround interlayer insulating film 21 and to be in contact with source contact electrode 16, for example, through vapor deposition. Pad electrode 23 composed, for example, of Al is formed to be in contact with drain electrode 20. Through the procedure above, MOSFET 1 (see FIG. 17) according to the third embodiment is completed.

A function and effect of MOSFET 1 and the method for manufacturing the same according to the third embodiment will now be described.

In MOSFET 1 according to the third embodiment, as in the MOSFET according to the first embodiment, gate insulating layer 15 formed on drift region 17 is greater in thickness than gate insulating layer 15 formed on body region 13. Thus, a capacitance of MOSFET 1 can be lowered while lowering in drain current which flows through channel region CH is suppressed.

In MOSFET 1 according to the third embodiment, n+ region 3a is formed in a region of drift region 17 including main surface 10a. Therefore, MOSFET 1 can realize a high breakdown voltage by providing an impurity concentration in drift region 17 to be low and can have a low resistance owing to n+ region 3a.

Channel region CH in MOSFET 1 according to the third embodiment is formed in a region in contact with main surface 10a, within body region 13 lying between n+ region 2a and n+ region 3b. Namely, MOSFET 1 according to the third embodiment is of an inversion type. Therefore, a channel length of MOSFET 1 is defined as interval Lch (see FIG. 17) along the channel direction at main surface 10a between first n+ region 2a and second n+ region 3b. Consequently, as will be described later, in the method for manufacturing MOSFET 1 according to the third embodiment, a channel length of MOSFET 1 can be determined in accordance with a dimension (interval Lch) of first mask layer 7 and fluctuation in channel length can be suppressed.

According to the method for manufacturing MOSFET 1 in the third embodiment, initially, first n+ region 3a and second n+ region 3b which are opposed to each other with the first region to be channel region CH lying therebetween are formed on epitaxial layer 12. Here, second n+ region 3b is formed as source region 14. Therefore, as compared with a case that source region 14 and n+ region 3 are formed separately from each other, the steps of forming a mask layer for ion implantation and implanting ions can be reduced. Thereafter, body region 13 is formed to contain a part of first n+ region 3a and second n+ region 3b. By doing so, first n+ region 3a and second n+ region 3b as source region 14 can simultaneously be formed such that channel region CH lies therebetween. In addition, since body region 13 is formed to include a part of first n+ region 3a and second n+ region 3b, channel region CH can be formed in a region in body region 13 which lies between first n+ region 3a and second n+ region 3b. Furthermore, here, interval Lch (see FIG. 17) in the in-plane direction of main surface 10a between first n+ region 2a and second n+ region 3b which are formed with channel region CH lying therebetween and with first mask layer 7 being interposed is determined by a dimension of first mask layer 7 (see FIG. 19), without being dependent on accuracy in alignment of first mask layer 7 with respect to main surface 10a. As described above, MOSFET 1 according to the third embodiment is of what is called an inversion type. Therefore, similarly to MOSFET 1 according to the first embodiment, a channel length of MOSFET 1 according to the third embodiment is equivalent to interval Lch in the in-plane direction of main surface 10a between first n+ region 2a and second n+ region 3b in body region 13. Consequently, as variation in interval Lch is suppressed as described above in the method for manufacturing MOSFET 1 according to the third embodiment, fluctuation in channel length of MOSFET 1 or in impurity concentration in channel region CH can be suppressed.

Though a case that the n-type is defined as the first conductivity type and the p-type is defined as the second conductivity type has been described in the first to third embodiments, the p-type may be defined as the first conductivity type and the n-type may be defined as the second conductivity type.

Though a MOSFET has been described in the first to third embodiments as an example of a silicon carbide semiconductor device, the present invention is not limited to this form. For example, the silicon carbide semiconductor device may be of a trench type or an insulated gate bipolar transistor (IGBT). The silicon carbide semiconductor device may be a vertical semiconductor device.

Though the embodiments of the present invention have been described above, the embodiments described above can variously be modified. In addition, the scope of the present invention is not limited to the embodiments described above. The scope of the present invention is defined by the terms of the claims, and is intended to include any modifications within the scope and meaning equivalent to the terms of the claims.

INDUSTRIAL APPLICABILITY

The present invention is particularly advantageously applied to a method for manufacturing a silicon carbide semiconductor device having channel region CH.

REFERENCE SIGNS LIST 1 silicon carbide semiconductor device (MOSFET); 2 n+ region; 2a, 3a first n+ region; 2b, 3b second n+ region; 4, 5S, 7 first mask layer; 5L second mask layer; 8 third mask layer; 4a, 4b, 5a, 5b, 7a, 7b, 8b opening portion; 9 mask layer (mask layer for forming p+ region); 10 silicon carbide layer; 10a first main surface (main surface); 10b second main surface; 11 base substrate; 12 epitaxial layer; 13 body region; 14 source region; 15 gate insulating layer; 16 source contact electrode; 17 drift region; 18 p+ region; 19 source interconnection; 20 drain electrode; 21 interlayer insulating film; 23 pad electrode; 27 gate electrode; and CH channel region CH.

The invention claimed is:

1. A method for manufacturing a silicon carbide semiconductor device, comprising the steps of:
preparing a silicon carbide layer having a main surface;
forming on said main surface, a first mask layer located on a first region to be a channel region and having a first opening portion on each of opposing regions between which said first region lies; and
forming a high-concentration impurity region having a first conductivity type and being higher in impurity concentration than said silicon carbide layer in said region exposed through said first opening portion, by implanting ions into said main surface with said first mask layer being interposed,
wherein
said preparing step includes the steps of
forming in said silicon carbide layer, a body region having a second conductivity type different from said first conductivity type and a drift region which is adjacent to said body region and has said first conductivity type,
forming a second mask layer having a second opening portion including a region in said body region where a source region having said first conductivity type is to be formed and covering at least said first region, and
forming said source region having said first conductivity type by implanting ions into said main surface with said second mask layer being interposed,
said first region is a part of said body region,
in said step of forming a first mask layer, said first mask layer is formed by partially removing said second mask layer, and said first opening portion in said first mask layer includes a portion reaching said drift region from one end portion of said first region on a side of said drift region and said second opening portion, and in said step of forming a first mask layer, said first mask layer is formed by partially removing said second mask layer using a mask film covering an end surface of said second opening portion in said second mask layer and having an opening portion on said second mask layer.

* * * * *